US006283776B1

(12) United States Patent
Gressly et al.

(10) Patent No.: US 6,283,776 B1
(45) Date of Patent: Sep. 4, 2001

(54) DEVICE PROVIDED WITH AT LEAST ONE LASER DIODE AND ASSEMBLY INCLUDING SUCH A DEVICE AND A CONNECTOR TO AN ELECTRIC POWER SUPPLY

(75) Inventors: André Gressly, Hünibach; Bruno Frei, Bern, both of (CH)

(73) Assignee: Lasag AG, Thun (CH)

( * ) Notice: Subject to any disclaimer, the term of this patent is extended or adjusted under 35 U.S.C. 154(b) by 0 days.

(21) Appl. No.: 09/480,677

(22) Filed: Jan. 11, 2000

(30) Foreign Application Priority Data

Jan. 15, 1999 (EP) ................................... 99100742

(51) Int. Cl.$^7$ .................................................. H01Z 29/00
(52) U.S. Cl. ............................................ 439/188; 200/51.1
(58) Field of Search ............................ 174/5 R; 439/22, 439/52, 53, 188, 225, 510, 511, 512, 513, 911, 131, 489, 490

(56) References Cited

U.S. PATENT DOCUMENTS

| | | | |
|---|---|---|---|
| 4,438,303 | | 3/1984 | Astier .................................. 200/51.1 |
| 5,071,360 | * | 12/1991 | Lindow et al. ....................... 439/133 |
| 5,112,237 | * | 5/1992 | Yang ..................................... 439/188 |
| 5,286,215 | * | 2/1994 | Dewey et al. ......................... 439/188 |
| 5,347,095 | * | 9/1994 | Zeder ................................. 200/51.09 |
| 5,366,382 | * | 11/1994 | Thumma ............................... 439/188 |
| 5,533,907 | * | 7/1996 | Kozel et al. ........................... 439/188 |
| 5,567,175 | * | 10/1996 | Warden et al. ........................ 439/490 |
| 5,810,622 | * | 9/1998 | Chang ................................... 439/622 |
| 5,820,395 | * | 10/1998 | Hashizawa ............................ 439/271 |
| 5,984,706 | * | 11/1999 | Kakuta et al. ......................... 439/310 |

FOREIGN PATENT DOCUMENTS 0 661 912 A2    7/1995   (EP) .
1197299         7/1970   (GB) .

OTHER PUBLICATIONS

Patent Abstracts of Japan vol. 018, No. 641(E–169), Dec. 6, 1994 & JP 06251830A (Matsushita Electric Ind Co Ltd), Sep. 9, 1994. Abstract.

* cited by examiner

*Primary Examiner*—Tulsidas Patel
*Assistant Examiner*—Charles Peschel
(74) *Attorney, Agent, or Firm*—Griffin & Szipl, P.C.

(57) ABSTRACT

The device is provided with at least one laser diode (2) and two electric connecting members for connection to an electric power supply (8) for supplying said at least one laser diode. It includes two elements (14, 16) which can be elastically deformed or moved, which are conductive electrically and arranged in a base electrically insulated from the two connecting members. The two elastically deformable or moveable elements are electrically connected and arranged so as to abut against two respective contact surfaces (34, 36) of the two connecting members when the device is not connected to said power supply by means of an external connector (40) which is complementary to the two electric connecting members. The two elastically deformable or moveable elements are respectively separated from the two connecting members when the external connector is introduced or are able to be respectively separated from said two connecting members when the external connector is introduced.

19 Claims, 1 Drawing Sheet

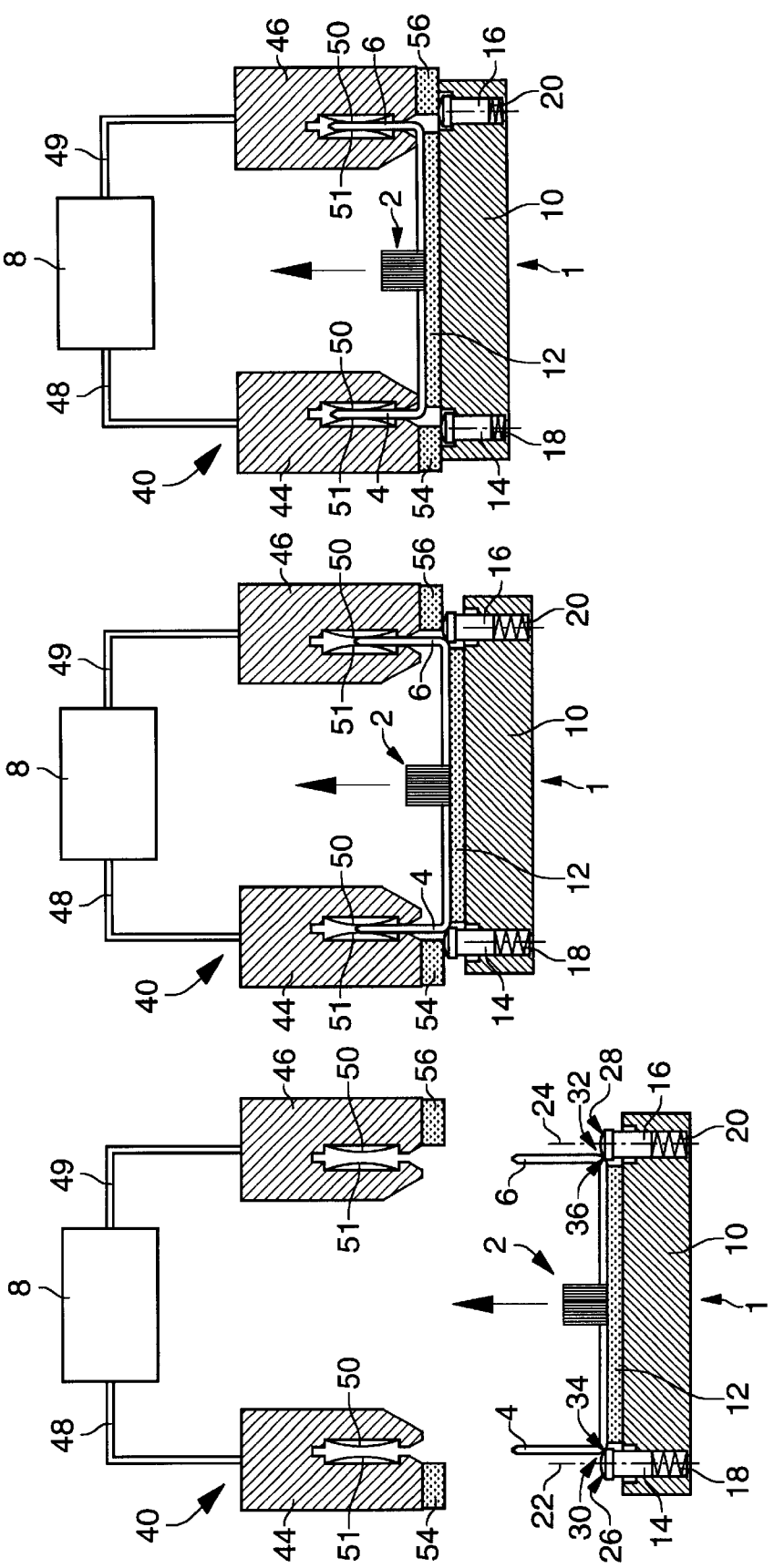

DEVICE PROVIDED WITH AT LEAST ONE LASER DIODE AND ASSEMBLY INCLUDING SUCH A DEVICE AND A CONNECTOR TO AN ELECTRIC POWER SUPPLY

BACKGROUND OF INVENTION

The present invention concerns the field of devices provided with at least one laser diode and installations or assemblies including such a device with a connector to an electric power supply intended for the device provided with at least one laser diode.

A laser diode is sensitive to the polarity of a supply voltage or any other voltage applied across the anode and the cathode of said laser diode or device provided with at least one laser diode which is supplied with power by said anode and said cathode. If a voltage of incorrect polarity exceeding the breakdown threshold of the laser diode is applied thereto, the voltage generally causes irreversible damage to the laser diode. Thus, it is important to protect the laser diodes and any device integrating such laser diodes from the application of incorrect polarity voltage in particular exceeding the breakdown threshold of such laser diodes and particularly from electric discharge which can occur when such laser diodes or devices including them are manipulated as long as they are not associated with a suitable electric power supply by means of a connector provided for such purpose.

An object of the present invention is to provide an electric protective system for devices provided with at least one laser diode and having connecting members for connection to an electric power supply intended for such devices.

The present invention therefore concerns a device provided with at least one laser diode and two electric connecting members for connection to an electric power supply for supplying said at least one laser diode, characterised in that it includes two elements which can be deformed elastically or moved, which are conductive electrically and arranged in a portion of the device electrically insulated from the connecting members, these two elastically deformable or moveable elements being electrically connected and arranged so as to abut against two respective contact surfaces of the two connecting members when the device is not connected to said power supply by means of an external connector which is complementary to the two electric connecting members. Said two elastically deformable or moveable elements are respectively separated from the two connecting members when the external connector connected to said power supply is introduced or are able to be respectively separated from said two connecting members after the external connector is introduced.

As a result of the features of the aforementioned device according to the invention, the two connecting members of the device, namely the anode and the cathode thereof, are protected by a short circuit established between these two members by means of elastically deformable or moveable elements which are conductive and electrically connected to each other. There is thus an efficient protection for any laser diodes included in the device according to the invention against the accidental application of a voltage of incorrect polarity and electric discharge when the device is handled before it is assembled with the external connector.

The invention also concerns an assembly or device including a device provided with at least one laser diode described hereinbefore and a connector used to connect such device electrically to an electric power supply. This connector has two members which are complementary to the connecting members of said device, these two complementary members having respectively two portions which are electrically insulated or formed of an insulating material which act as stops exerting respectively a pressure on the two elastically deformable or moveable elements when the connector is assembled with the device according to the invention, so as to compress or move these two elements and to keep them separate from the two connecting members of the device once the latter is assembled with the connector.

Such an assembly can form a laser, in particular a laser whose active medium is optically pumped by means of laser diodes. The laser diodes are integrated in devices according to the invention and mounted on the laser armature or enclosure which includes one or more of the connectors described hereinbefore. Thus, the device including the laser diodes are protected electrically until they are installed in the laser, which allows the complete functionality of the laser obtained to be guaranteed.

BRIEF DESCRIPTION OF DRAWINGS

The present invention will be described hereinafter with reference to a particular embodiment, given by way of non limiting example, this description being made with reference to the annexed drawings, in which:

FIG. 1 shows schematically a device according to the invention and an external connector which is completely separated therefrom;

FIG. 2 shows the same elements as FIG. 1 in an intermediate assembly position; and FIG. 3 shows the same elements as FIGS. 1 and 2, but in a final assembly position.

DETAILED DESCRIPTION OF INVENTION

With reference to FIGS. 1 to 3, an embodiment of a device provided with at least one laser diode according to the invention and an assembly including such a device and a connector intended to connect the device electrically to an electric power supply will be described hereinafter.

Device 1 includes a laser transmission unit 2 formed of at least one laser diode and two electric connection members 4 and 6 defining respectively a cathode and an anode of said device 1. Members 4 and 6 are used as electric connection means between an external electric power supply 8 and laser unit 2. Unit 2 and members 4 and 6 are arranged on a base 10 made of electrically conductive material and are electrically insulated from said base 10 by an insulating layer 12. Connection members 4 and 6 are each L shaped.

According to the invention, the device also includes two contact studs 14 and 16 formed of an electrically conductive material respectively associated with two springs 18 and 20 arranged in base 10 to exert a force along longitudinal directions 22 and 24 on said contact studs. Contact studs 14 and 16 are electrically connected by base 10 and have respectively heads 26 and 28. Those skilled in the art can easily design any other electric connection means between contact studs 14 and 16. For example, contact studs 14 and 16 can be arranged with springs 18 and 20 in metal tubes arranged in any type of base, i.e. not necessarily a conductive base. These two tubes can be electrically connected by an electric wire, a conductive plate or any other known means. Springs 18 and 20 can be replaced by other compressible elements.

It will also be noted that simple cylindrical pins or blocks, having any transverse profile suited to the function of contact studs 14 and 16, which will be described hereinafter, may be provided in place of contact studs 14 and 16. Next, in place of contact studs 14 and 16 respectively associated with springs 18 and 20, it is possible to provide two elements able to be deformed elastically along directions 22 and 24.

Connection members 4 and 6 each have in the region of the bend 30, 32 respectively thereof, a contact surface 34, 36 respectively, against which heads 26 and 28 abut when device 1 is separated by a connector which is intended to connect it to external power supply 8, said connector being described hereinafter. it will be noted that heads 26 and 28 of contact studs 14 and 16 and contact surfaces 34 and 36 can be configured in a complementary manner so that the contact surfaces are sufficiently large to guarantee a good electric contact between contact studs 14 and 16 and members 4 and 6. Thus, in the state of device 1 shown in FIG. 1, members 4 and 6 are electrically connected to each other by contact studs 14 and 16. In other words, contact studs 14 and 16 generate a short circuit between anode 4 and cathode 6.

It will be noted that directions 22 and 24 are not necessarily parallel to each other, but can also be slightly oblique relative to the direction of introduction of the external connector. It will also be noted that heads 26 and 28 extend beyond members 4 and 6. However, for the purposes of the invention, contact studs 14 and 16 need only each have one surface which is not covered by a portion of device 1.

FIGS. 1 to 3 also show a connector 40 which includes two members 44 and 46 complementary to connection members 4 and 6 of device 1. Complementary members 44 and 46 define two female contact members shaped for the introduction of the two members 4 and 6 defining male contact members. Members 44 and 46 are electrically connected to an electric power supply 8, which is represented schematically in the Figures by two electric wires 48 and 49. Each of members 44 and 46 have two elastic strips 50 and 51 arranged so as to exert lateral pressure on the portions of male members 4 and 6 introduced into female members 44 and 46 when connector 40 is assembled to device 1, as shown in FIGS. 2 and 3.

Finally, members 44 and 46 respectively include two portions made of electrically insulating material 54 and 56 which are arranged so as to abut against support surfaces defined by the external surfaces of heads 26 and 28 of elements 14 and 16 when device 1 is introduced into connector 40.

According to the invention, when connector 40 is assembled to device 1, portions 54 and 56 of said connector abut respectively against the two heads 26 and 28 of elastically moveable elements 14 and 16 so as to materially separate them from connection members 4 and 6 and thus to separate electrically members 4 and 6 from elements 14 and 16.

FIG. 2 shows an intermediate introduction position of device 1 in connector 40, this intermediate position corresponding to a position in which blocks 54 and 56 are in contact with heads 26 and 28 without any movement of contact studs 14 and 16. In this position, the short circuit between members 4 and 6 is still achieved whereas the male portions of members 4 and 6 are already introduced into female members 44 and 46 so as to establish an electric contact between laser unit 2 and electric power supply 8.

By continuing the introduction of device 1 into connector 40 to the final position shown in FIG. 3, connector 40 exerts pressure on contact studs 14 and 16 via blocks 54 and 56. This pressure generates a movement of contact studs 14 and 16, which are thus finally separated from members 4 and 6 to eliminate the initial short circuit between these members 4 and 6.

It will be noted that when device 1 and connector 40 are disassembled, contact studs 14 and 16 which are moveable elastically, then move in the direction of members 4 and 6 until they are again in contact therewith. Thus, laser unit 2 is automatically protected from any voltage accidentally applied to device 1 according to the invention.

It will be noted that parts 54 and 56 could also be formed of an electrically conductive material, but these parts are then electrically insulated from the metal parts of members 44 and 46, which are in electric contact with connection members 4 and 6.

It will also be noted that elastic strips 50 and 51 can be replaced by other equivalent elements assuring a proper electric contact with members 4 and 6. For example, it is possible for the two branches defined by each of members 44 and 46 to be able to be separated elastically, in particular by an angular movement. Any type of suitable connector known to those skilled in the art can be envisaged within the scope of the present invention. Members 44 and 46 can be arranged so that the lateral force exerted on members 4 and 6 generates a static friction force which is greater than the force exerted by springs 18 and 20 on contact studs 14 and 16. Means for securing device 1 and connector 40 can however be provided.

In another less advantageous embodiment, the connection elements can be moved, without however being elastically moveable. In a first variant, it is necessary to separate them materially from members 4 and 6 by a mechanism provided for this purpose once device 1 and connector 40 have been assembled. In another variant, contact studs 14 and 16 are separated from members 4 and 6 by connector 40, but swing into a mechanically stable position in which they are materially separated from members 4 and 6. One can further provide a mechanism allowing them to be brought into a position of contact with members 4 and 6. This variant is similar to a switch having two stable levels ON/OFF, the passage from the ON position to the OFF position being effected by connector 40 whereas in the first variant mentioned hereinbefore, passage from the ON position to the OFF position is effected using a separately actuated mechanism.

What is claimed is:

1. A device provided with at least one laser diode and two electric connecting members for connecting said laser diode to an electric power supply, said device including two electrically conductive elements which are arranged in a portion of the device electrically insulated from the connecting members, said electrically conductive elements being electrically connected in a separable manner to the two connecting members, said two electrically conductive elements being arranged so as to abut against two respective contact surfaces of the two connecting members when the device is not connected to said power supply by means of an external connector which is complementary to the two electric connecting members, and being respectively separated from the two connecting members when the external connector connected to said power supply is introduced.

2. A device according to claim 1, wherein said two electrically conductive elements are able to be separated via the action of pressure along a direction of introduction of said external connector, these two elements respectively having two support surfaces against which two portions of the external connector can abut when the latter is introduced in order to electrically separate said two connecting members from the two electrically conductive elements.

3. A device according to claim 2, wherein each of the two connecting members is L shaped, said two contact surfaces being situated respectively at two bends borne respectively by said two members.

4. An assembly including a device according to claim 2 and a connector distinct from said device which is used to connect said device electrically to an electric power supply, said connector having two members complementary to the two connecting members of said device, these two complementary members respectively having two electrically insulated portions or formed of an electrically insulating material which act as stops respectively exerting a pressure on said two electrically conductive elements when said connector is assembled with said device, so as to separate these two elements from the two connecting members of said device and to keep them separate once the device and the connector are assembled.

5. A device according to claim 2, wherein said two electrically conductive elements are elastically deformable.

6. A device according to claim 2, wherein said two electrically conductive elements are elastically movable.

7. A device according to claim 5, wherein each of said two elastically deformable elements is formed by a block of compressible material allowing an elastic compression of each of these two elements along said direction of introduction.

8. A device according to claim 6, wherein each of said two elastically moveable elements is formed by a pin or contact stud associated with a spring allowing an elastic movement of each of these two elements along said direction of introduction.

9. An assembly according to claim 4, wherein the two complementary members of said connector have elastically deformable portions arranged to exert a lateral pressure on the two connecting members of said device so as to assure a good electric contact with the two connecting members of said device and to keep the latter and said connector assembled once they have been assembled.

10. An assembly according to claim 4, wherein the two complementary members of said connector have elastically moveable portions arranged to exert a lateral pressure on the two connecting members of said device so as to assure a good electric contact with the two connecting members of said device and to keep the latter and said connector assembled once they have been assembled.

11. A device according to claim 7, wherein each of the two connecting members is L shaped, said two contact surfaces being situated respectively at two bends borne respectively by said two members.

12. A device according to claim 8, wherein each of the two connecting members is L shaped, said two contact surfaces being situated respectively at two bends borne respectively by said two members.

13. A device provided with at least one laser diode and two electric connecting members for connecting said laser diode to an electric power supply, the device including two electrically conductive elements which are arranged in a portion of the device electrically insulated from the connecting members, these two electrically conductive elements being electrically connected in a separable manner to the two connecting members, said two electrically conductive elements being arranged so as to abut against two respective contact surfaces of the two connecting members when the device is not connected to said power supply by means of an external connector which is complementary to the two electric connecting members, and being able to be respectively separated from the two connecting members after the external connector is introduced.

14. A device comprising:
a connector having a male part and a female part and a laser diode supported on said male part;
said female part having first and second electrical contacts connectable to a power supply;
said male part comprising,
first and second conductive connecting members connected to said diode and insertable into said female part to make contact with said first and second electrical contacts, respectively;
first and second electrically conductive elements, said first and second electrically conductive elements being electrically connected together and normally in contact with said first and second conductive connecting members, respectively, when said male part and said female part are apart;
said female part having an insulated portion acting on said first and second electrically conductive elements, as said first and second conductive connecting members are inserted into said female part, to break electrical connection between said first and second electrically conductive elements and said first and second conductive connecting members after said first and second conductive connecting members have made electrical contact with said first and second electrical contacts.

15. A device as claimed in claim 14 wherein said first and second conductive connecting members are L-shaped members, said first and second electrically conductive elements normally being in engagement with said first and second L-shaped members, respectively, at bends in said L-shaped members.

16. A device as claimed in claim 14 wherein said first and second electrically conductive elements movably mounted in first and second holes, respectively, in a base member of said male part and resiliently urged into contact with said first and second conductive connecting members, respectively.

17. A device as claimed in claim 16 wherein said base member is electrically conductive and comprises means electrically connecting said first and second electrically conductive elements.

18. A device as claimed in claim 16 wherein springs, disposed in said holes, resiliently urge said first and second electrically conductive elements into contact with said first and second conductive connecting.

19. A device as claimed in claim 16 wherein said first and second electrically conductive elements comprise a compressible material.

* * * * *